United States Patent
Meagley

(10) Patent No.: US 7,875,415 B2
(45) Date of Patent: Jan. 25, 2011

(54) HELICAL PIXILATED PHOTORESIST

(75) Inventor: Robert P. Meagley, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 68 days.

(21) Appl. No.: 11/323,612

(22) Filed: Dec. 30, 2005

(65) Prior Publication Data

US 2007/0154836 A1   Jul. 5, 2007

(51) Int. Cl.
*G03C 1/00* (2006.01)
(52) U.S. Cl. .................................. 430/270.1
(58) Field of Classification Search ............... 430/270.1
See application file for complete search history.

(56) References Cited

U.S. PATENT DOCUMENTS

| | | | | |
|---|---|---|---|---|
| 6,403,287 B1 * | 6/2002 | Jung et al. | ................... | 430/322 |
| 6,455,223 B1 * | 9/2002 | Hatakeyama et al. | .... | 430/270.1 |
| 6,677,406 B2 * | 1/2004 | Ogawa et al. | ................ | 525/437 |
| 6,783,917 B2 * | 8/2004 | Blakeney et al. | .......... | 430/270.1 |
| 7,326,520 B2 * | 2/2008 | Joo et al. | .................. | 430/280.1 |
| 2002/0122874 A1 * | 9/2002 | Kim et al. | ................... | 427/2.11 |
| 2004/0110133 A1 * | 6/2004 | Xu et al. | ......................... | 435/6 |
| 2006/0068318 A1 * | 3/2006 | Meagley et al. | ........... | 430/270.1 |
| 2006/0078820 A1 * | 4/2006 | Fedynyshyn | ............. | 430/270.1 |
| 2007/0122734 A1 * | 5/2007 | Roberts et al. | ............ | 430/270.1 |

* cited by examiner

*Primary Examiner*—Cynthia H Kelly
*Assistant Examiner*—Connie P Johnson
(74) *Attorney, Agent, or Firm*—Blakely, Sokoloff, Taylor & Zafman LLP

(57) ABSTRACT

A helical pixilated photoresist includes a photoacid generator, a photoimageable polymer comprising a self-assembly moiety and a solubility switch, the photoimageable polymer having a helical structure. In one embodiment the helical pixilated photoresist is formed of a photoimageable polymer comprising a pyridine-based quencher copolymer and a solubility switch copolymer, wherein the photoimageable polymer has a helical structure formed by pi-stacking of the pyridine-based quencher copolymer. The helical pixilated photoresist is applied to a substrate and irradiated and developed to form a patterned photoresist.

4 Claims, 16 Drawing Sheets

Polybiquinolinedicarboxylicacid-co-biquinolinebismethylcarbinol
Molecular formula = $C_{44}H_{34}N_4O_5$ 2,7-di-tert-butyl-9,9-dimethylxanthene-4,5-dicarboxylic acid-CO-2,5-dimethyl-hexane-2,5-diol:

Diol linkers

X =

120

121

122

123

124

125

Molecular formula = $C_{33}H_{44}O_5$

Top View

PAG

HELICAL PIXILATED PHOTORESIST

BACKGROUND

1. Field

The present invention relates to the field of photolithography to form integrated circuits and more particularly to the field of photoresists used in photolithography.

2. Discussion of Related Art

Photolithography is used in the field of integrated circuit processing to form the patterns that will make up the features of an integrated circuit. A photoresist is employed as a sacrificial layer to transfer a pattern to the underlying substrate. This pattern may be used a template for etching or implanting the substrate. Patterns are typically created in the photoresist by exposing the photoresist to radiation through a mask. The radiation may be visible light, ultraviolet (UV) light (which includes "broad band", "g-line", and "i-line"), deep ultraviolet light (DUV), extreme ultraviolet (EUV) light, or an electron beam. In the case of a "direct write" electron beam, a mask is not necessary because the features may be drawn directly into the photoresist. Most photolithography is done using either the "i-line" method or the chemical amplification (CA) method. In the i-line method components of the photoresist become directly soluble when irradiated and may be removed by a developer. In the chemical amplification method the radiation applied to the photoresist causes the decomposition of a photo-acid generator (PAG) that causes the generation of a small amount of acid throughout the resist. The acid in turn causes a cascade of chemical reactions either instantly or in a post-exposure bake that increase the solubility of the resist such that the resist may be removed by a developer. An advantage of using the CA method is that the chemical reactions are catalytic and therefore the acid is regenerated afterwards and may be reused, thereby decreasing the amount of radiation required for the reactions making it possible to use shorter wavelengths of light such as EUV. The photoresist may be positive tone or negative tone. In a positive tone photoresist the area exposed to the radiation will define the area where the photoresist will be removed. In a negative tone photoresist the area that is not exposed to the radiation will define the area where the photoresist will be removed. The CA method may be used with either a positive tone photoresist or a negative tone photoresist.

The modulation of the performance of a photoresist is controlled within a photoresist formulation by the choice of photo-acid generator (PAG), the control of polymer molecular weight, the polymer primary structure, molecular weight distribution, polymer side group's structure, species relative ratios, and the solvent system.

DETAILED DESCRIPTION

Described herein are helical pixilated photoresist compositions that are preorganized through the self-assembly of the components into helical units to form a pixilated photoresist. Methods of using such a helical pixilated photoresist composition are also described. In the following description numerous specific details are set forth. One of ordinary skill in the art, however, will appreciate that these specific details are not necessary to practice embodiments of the invention. While certain exemplary embodiments of the invention are described and shown in the accompanying drawings, it is to be understood that such embodiments are merely illustrative and not restrictive of the current invention, and that this invention is not restricted to the specific constructions and arrangements shown and described because modifications may occur to those ordinarily skilled in the art. In other instances, well known semiconductor fabrication processes, techniques, materials, equipment, etc., have not been set forth in particular detail in order to not unnecessarily obscure embodiments of the present invention.

Greater modulation of the performance of a photoresist formulation is achieved by organizing a photoresist matrix around a catalyst precursor, such as a photo-acid generator, to define and control the distribution of species before and during the creation of catalytic species, which in many cases is a photo-generated acid, upon irradiation of the photoresist. The photoresist matrix is organized around the catalyst precursor in a helical formation to form a helical pixilated photoresist. The helical formation is created by the self-assembly of a photoimageable polymer having a quencher moiety and a solubility switch.

Figure 1A:
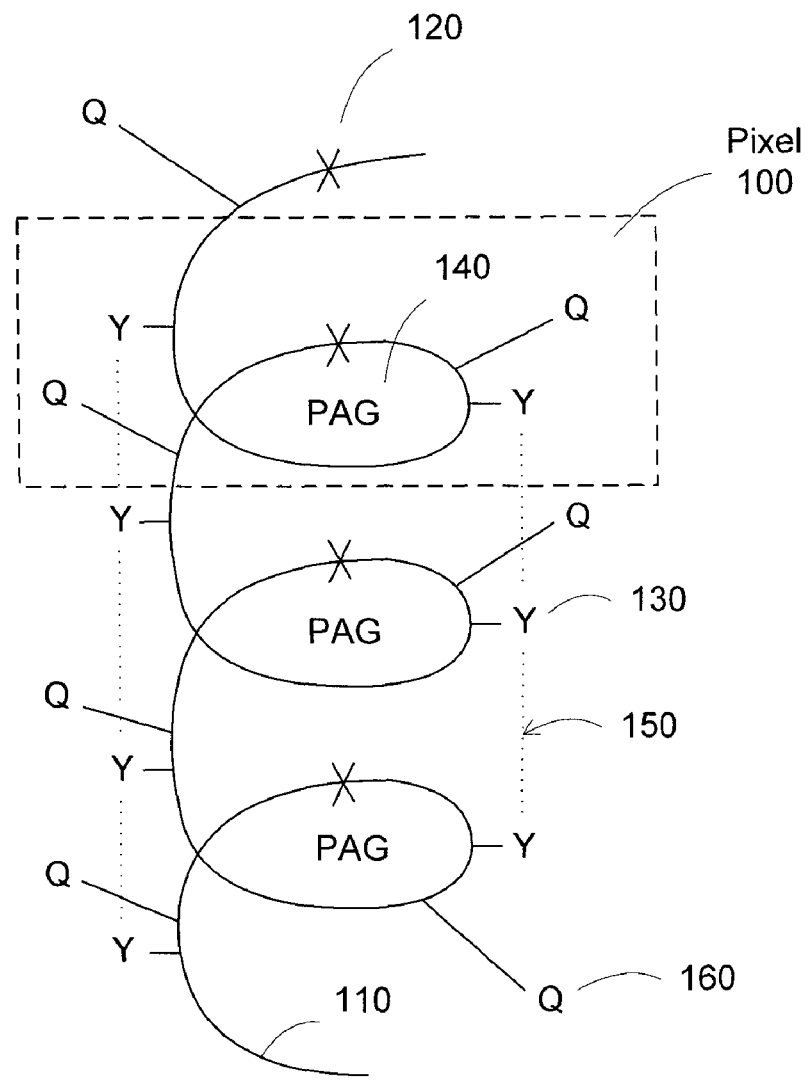
FIGS. 1a-1c are illustrations of embodiments of helical pixilated photoresists.

The main components of a photoresist include a photoacid generator (PAG), a photoimageable species (such as a polymer), a solubility switch to change the solubility of the photoimageable species when activated by the photo-generated acid produced by the photoacid generator, and a quencher to control the activity of the photo-generated acid. A quencher is a basic species to neutralize the photo-generated acid. FIG. 1A illustrates an embodiment of a deliberately engineered arrangement of the components of a helical pixilated photoresist composition. The photoimageable species 110 is a photoimageable polymer having a solubility switch (X) 120 and a self-assembly moiety (Y) 130. The helical pixilated photoresist may also include quenchers (Q) 160. The photoimageable polymer may be a folded polymer, a random helix, a pseudohelix, or a helix. In the instance where the polymer is a helix, the self-assembly of the helical structure by the quenchers is the formation of a super-helix. A helical structure is defined as a compound having at least one turn of a helix and may be a closed loop. The self-assembly moiety (Y) 130 promotes self-assembly of the helical structure. The self-assembly moiety (Y) 130 may also act as a quencher or as a solubility switch. In an embodiment where the self-assembly moiety (Y) 130 acts as a solubility switch there may not be any need for the additional solubility switches 120 as illustrated in FIG. 1A. Similarly, in and embodiment where the self-assembly moiety (Y) 130 acts as a quencher there may not be any need for the additional quenchers 160 as illustrated in FIG. 1A. In an alternate embodiment, the quencher 130 may be a separate from the photoimageable polymer and dissolved into the solvent of the helical pixilated photoresist composition.

The self-assembly of the photoimageable polymer into a helical structure may be promoted by pi-stacking, ionic interactions, hydrogen bonding, or hydrophobic forces. These forces may be the primary force or in any combination with one another. Additionally, covalent bonds may also form the helical structure. Self-assembly into a helical structure may be easy to promote in many embodiments because many polymers, and in particular the ones described herein, will naturally fold into a helix. In one embodiment, pi-stacking 150 is the force between the aromatic chemical structures of the quencher 130 illustrated in FIG. 1A that maintains the helical structure of the photoimageable polymer. The aromatic chemical structures may be aryl groups or an amine-based group such as pyridine or bipyridine. A self-assembly moiety that is a hydrophobic species that influences self-assembly of the photoimageable polymer into a helical structure by hydrophobicity is a fluorous group. A self-assembly moiety that is charged and influences self-assembly of the photoimageable polymer into a helical structure by charge interactions is a nitrile group such as an aryl nitrile, an alkyl nitrile, or an alkyl amine.

In the embodiment illustrated in FIG. 1A, the quenchers 160 are positioned on the outside of the helix at a distance beyond the PAG 140 to surround the PAG 140 so that the photoacid may not diffuse beyond the boundary formed by the quenchers 160 and react with further switches beyond the irradiation portion of the photoresist after the PAG 140 is irradiated to form a photoacid that reacts with the switch 120. A pixel 100 is formed by a single turn of the helical photoimageable polymer including at least one quencher, a solubility switch, and a photo-acid generator. In this embodiment, the exterior of the helix is relatively non-polar and the interior is polar.

Figure 1B:
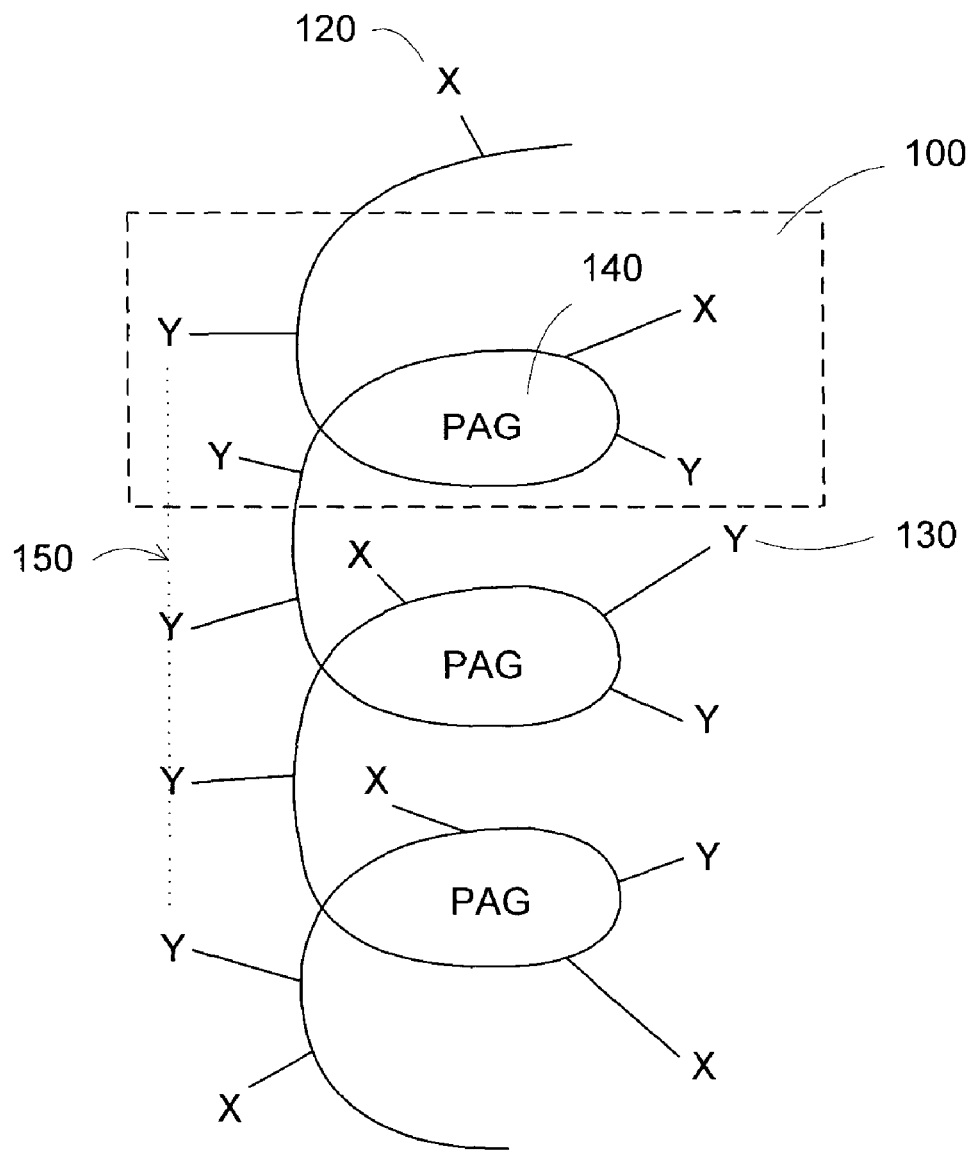
Figure 1C:
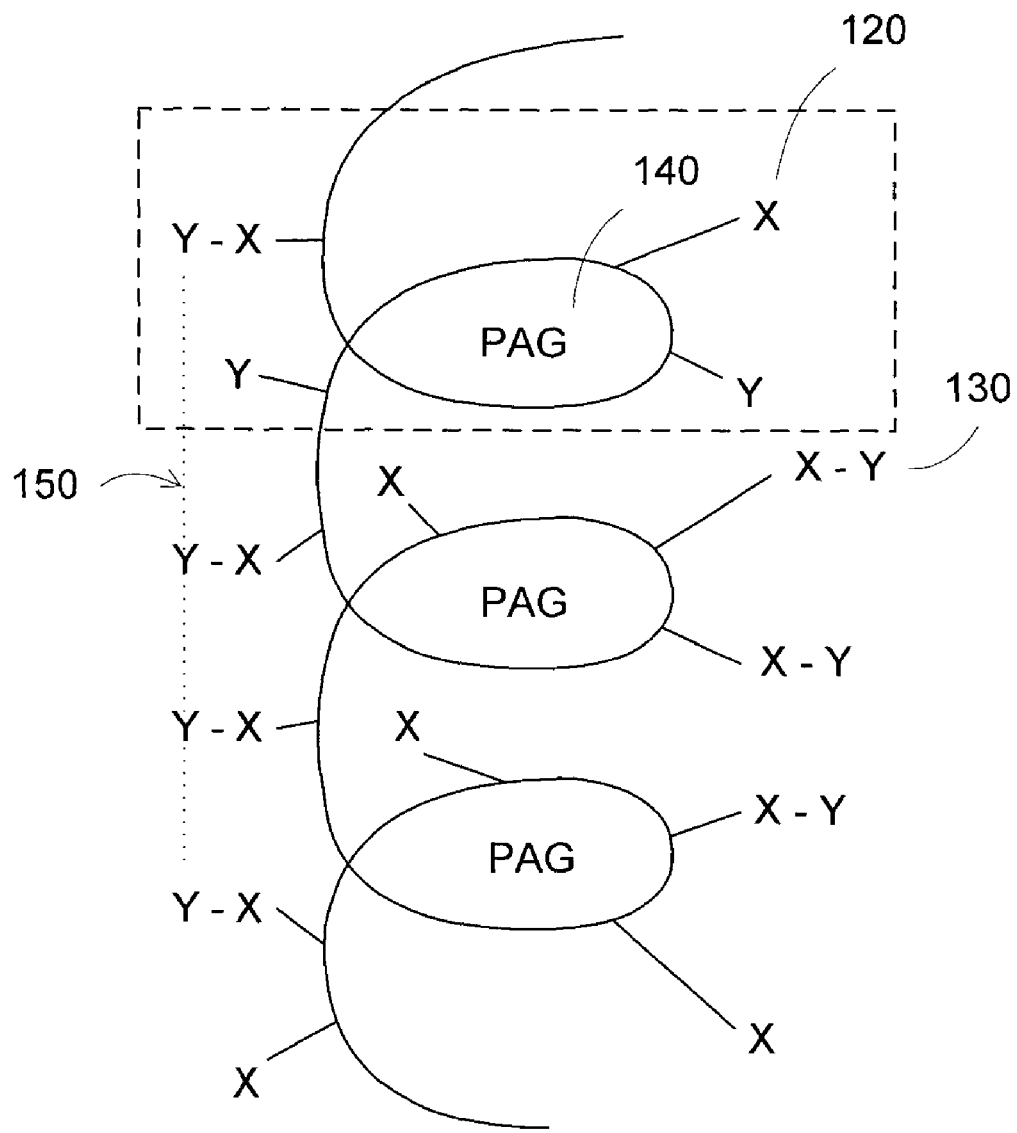

FIGS. 1B and 1C illustrate alternate embodiments of the helical pixilated photoresist of FIG. 1A. In FIG. 1A the solubility switch breaks the photoimageable polymer backbone. In FIGS. 1B and 1C the solubility switch (X) 120 is merely cleaved to reveal solubility promoting groups, but does not break the polymer backbone. In FIG. 1C, this process cleaves the groups (Y) 130 that promote self-assembly and thus designs based on FIG. 1C are rendered more soluble through disruptions of self-assembly.

The architecture of the photoresist composition may be further organized with polar and or non-polar groups that further contribute to the molecular organization, for example, the clustering of polar and or non-polar groups to the exterior or interior of the helix to form a micellar structure. The micellar structure serves to sequester species within the interior of the helix, which in this photoresist composition is the photoacid generator. A traditional micelle has a non-polar interior and can sequester non-polar photoacid generators. In an inverse micelle, the interior is polar and can thus sequester polar photoacid generators.

Figure 2A:
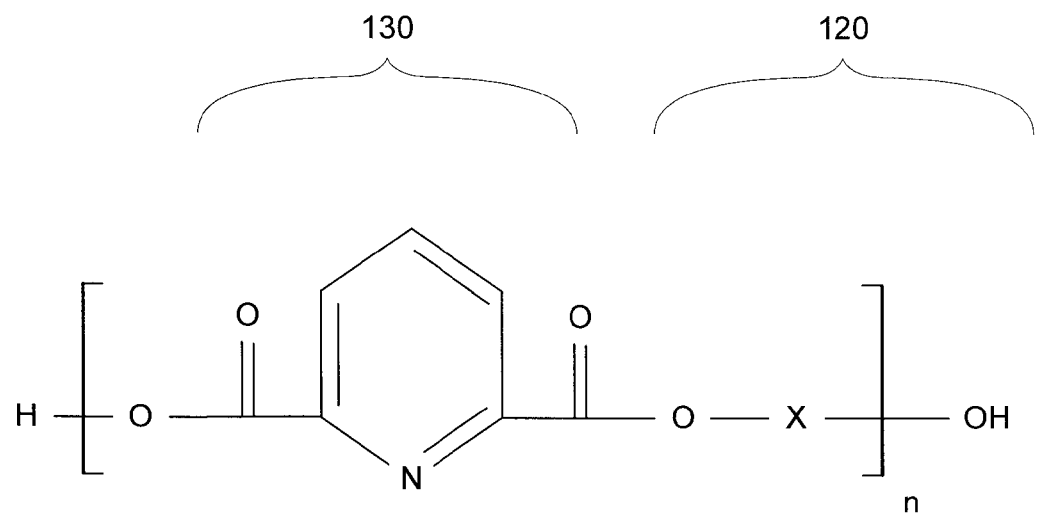
FIGS. 2c-2f are illustrations of the primary structures of polymers comprising embodiments based on tertiary polyesters.
FIGS. 2g-2h are illustrations of tertiary diol designs for application as co-monomers in the synthesis of tertiary polyesters.
Figure 2B:
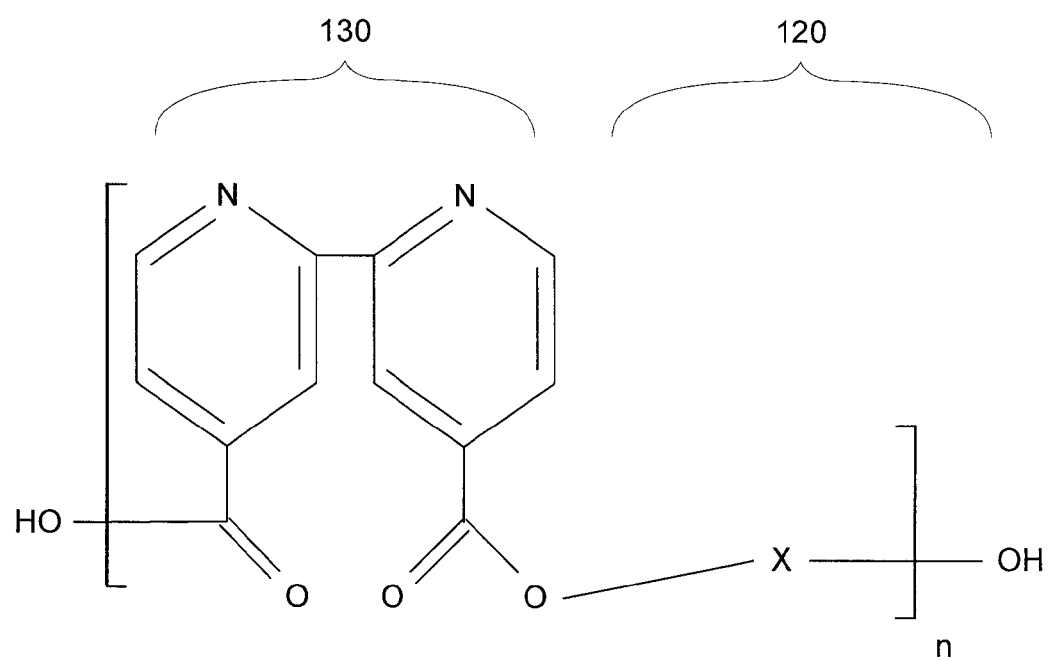
Figure 2C:
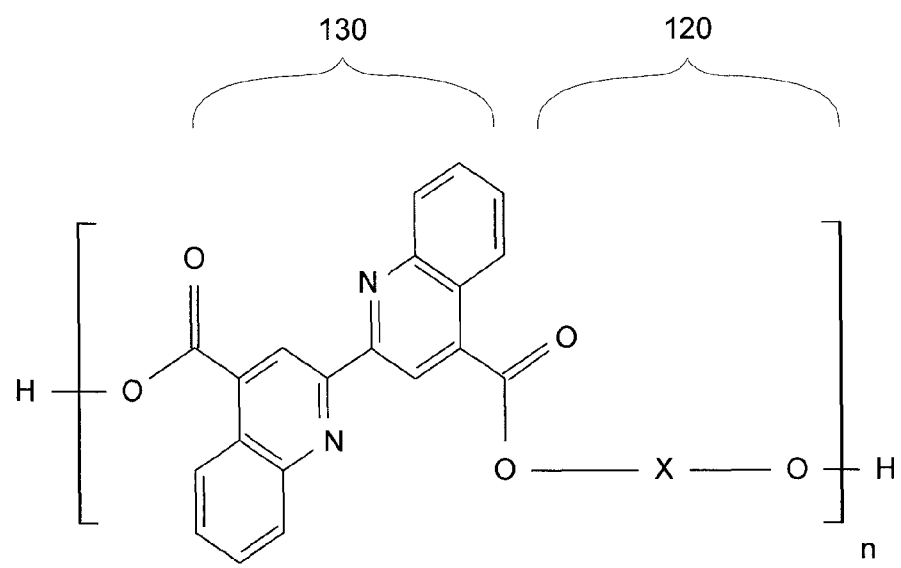
Figure 2D:
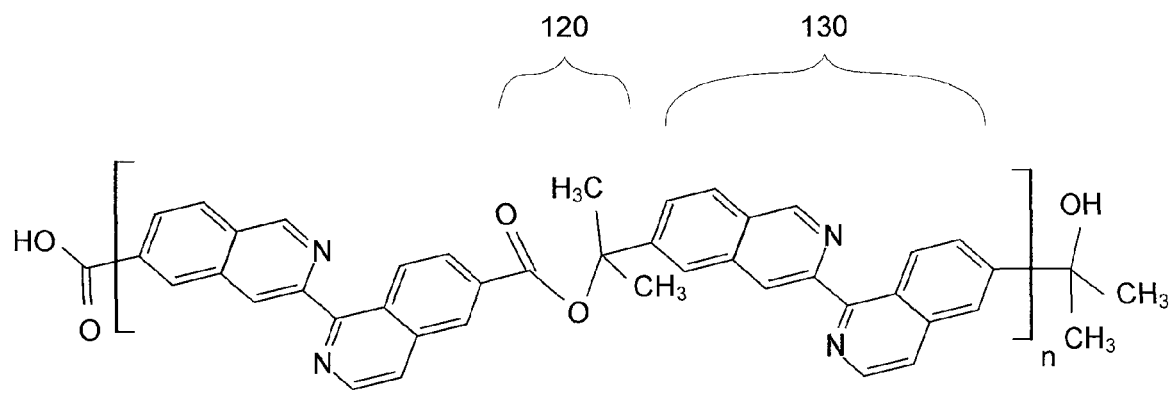
Figure 2E:
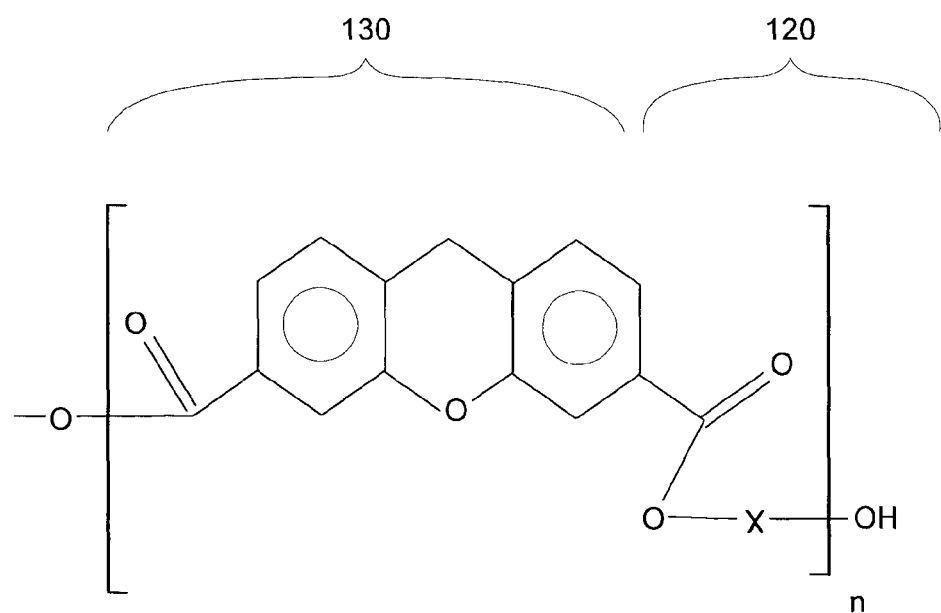
Figure 2F:
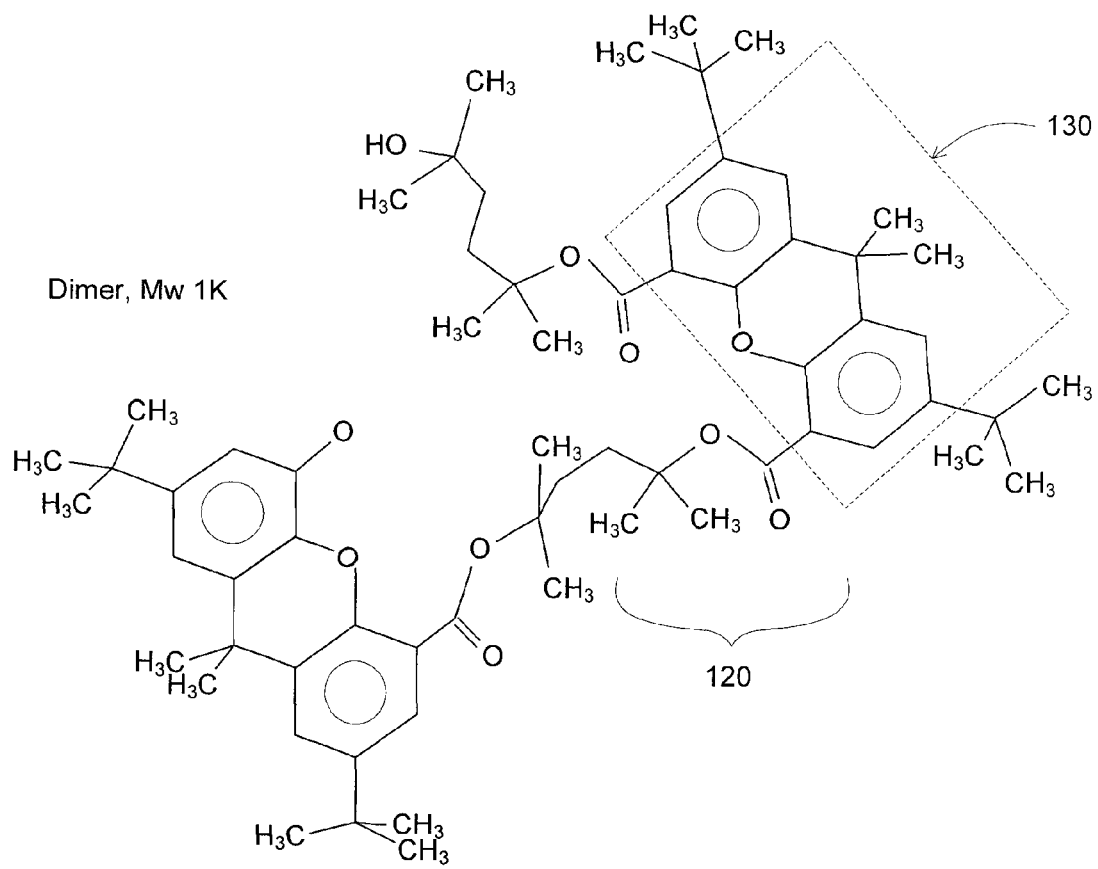
Figure 2G:
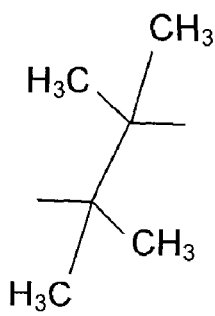
Figure 2G:
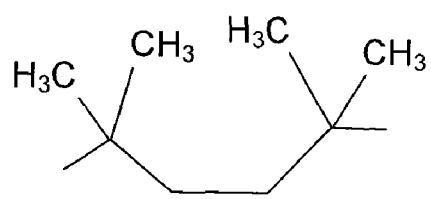
Figure 2G:
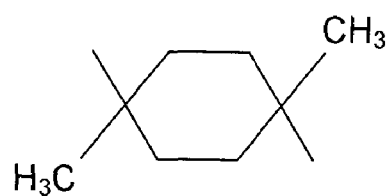
Figure 2H:
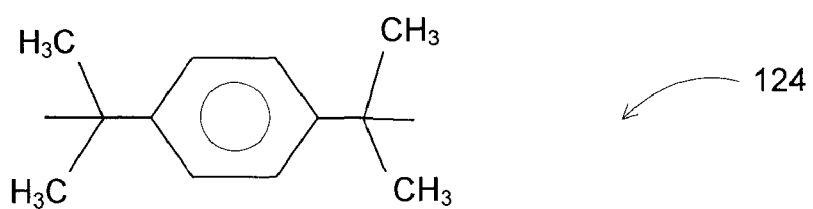
Figure 2H:
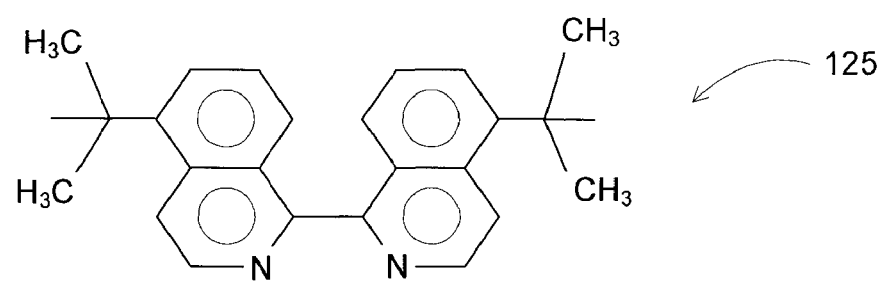

The solubility switch (X) 120 breaks the photoimageable polymer backbone so that the irradiated portions of the helical pixilated photoresist breaks up into pieces that may be solvated by a developer solution. In one embodiment, the helical pixilated photoresist composition may be a photoacid generator plus a photoimageable polymer comprising a quencher copolymer and a solubility switch copolymer such as those illustrated in FIGS. 2A-2H. FIG. 2A illustrates a photoimageable polymer formed of a polypyridine quencher copolymer. FIG. 2B illustrates a polybipyridine quencher copolymer. A polybiquinoline quencher copolymer is illustrated in FIGS. 2C and 2D. A xanthine dicarboxylic acid quencher copolymer is illustrated in FIGS. 2E and 2F. FIG. 2F illustrates one particular embodiment, where the xanthine dicarboxylic acid quencher copolymer is 2,7-di-tert-butyl-9,9-dimethylxanthene-4,5-dicarboxylic acid-CO-2,5-dimethyl-hexane-2,5-diol. The aromatic portions of these quencher copolymers 130 form pi-stacked complexes that in addition to the orientation of the pair of acid groups therein, reinforce a helical conformation of the polymer. Examples of solubility switch copolymers 120 are illustrated in FIGS. 2G and 2H as 121-125. In FIG. 2G, 121 is pinacol (2,3-dimethyl-2,3-butanediol), 122 is 2,5-dimethyl-2,5-hexanediol, and 123 is 1,4-dimethyl-1,4-cyclohexanediol. The different solubility switch copolymers 121-125 are interchangeable with the different pyridine-based quencher copolymers illustrated in FIGS. 2A-2F. The solubility switches may be selected based on relative vibrational freedom and hence rigidity of the resulting polymers. Thus, a tertiary polyester formed from bipyridinedicarboxylic acid, such as FIG. 2B, could incorporate a solubility switch such as 123 to be more rigid and express higher temperature glass transition and thermal stability, or conversely could incorporate a solubility switch such as 122 to be more flexible and express lover temperature glass transition and improved annealing characteristics. The ability to tune and engineer the thermal properties of photoresist polymers is important in order to optimize performance for particular applications.

Figure 3A:
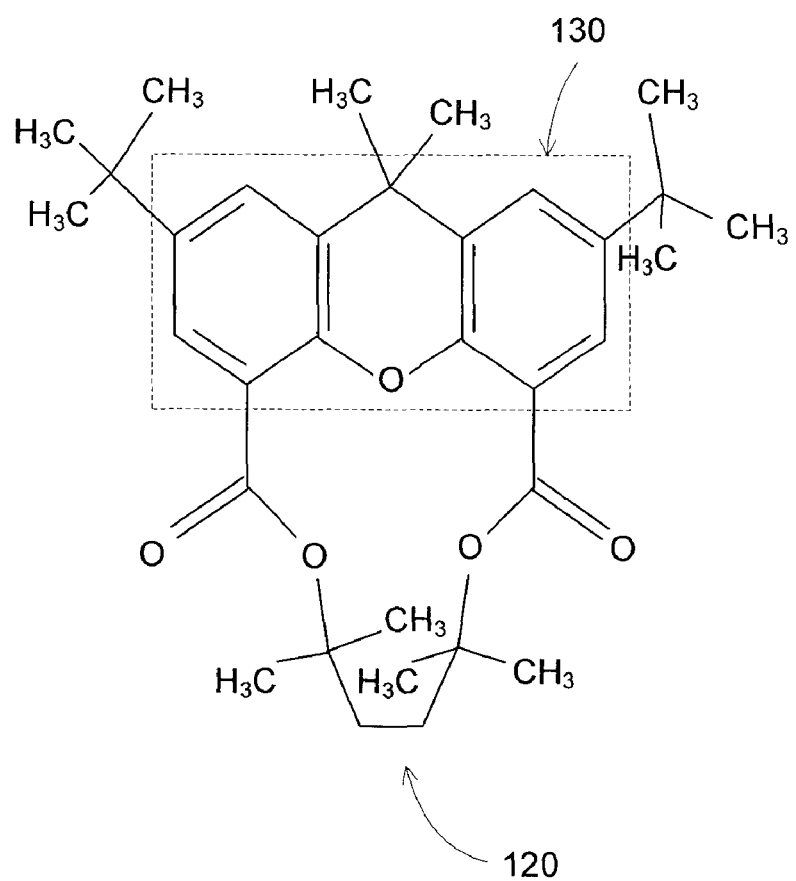
FIG. 3a-3b are illustrations of dimeric closed-loop embodiments of helical pixilated photoresists.
Figure 3B:
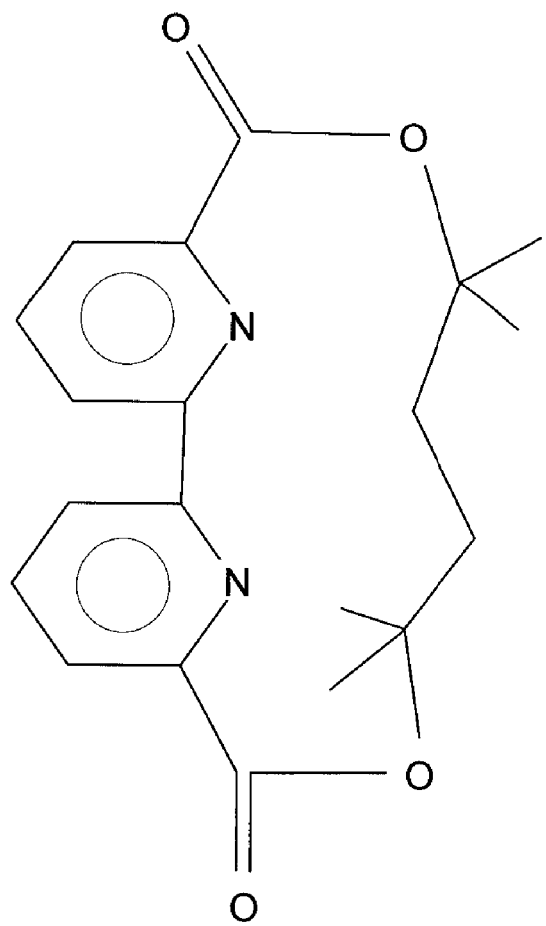

FIGS. 3A and 3B illustrate examples of helical photoimageable polymers where the polymer forms a single turn of a helix (i.e. a closed loop.) FIG. 3A illustrates a closed loop dimer formed from bist-butyldimethylxanthinedicarboxylate and dimethylhexanediol and FIG. 3B illustrates a closed loop dimer formed from bipyridinedicarboxylate and dimethylhexanediol. In a helical pixilated photoresist formed by these helical photoimageable polymers, the photo-acid generator is sequestered in the center of the ring formed by the photoimageable polymer. The helical photoimageable polymers of FIG. 3B has both a quencher 130 and a solubility switch 120. These designs are examples of what is known as a "molecular glass" photo resist. The molecular glass photoresist limits the pixel size to the smallest possible extent in order to enable imaging of the smallest possible objects.

Figure 4:
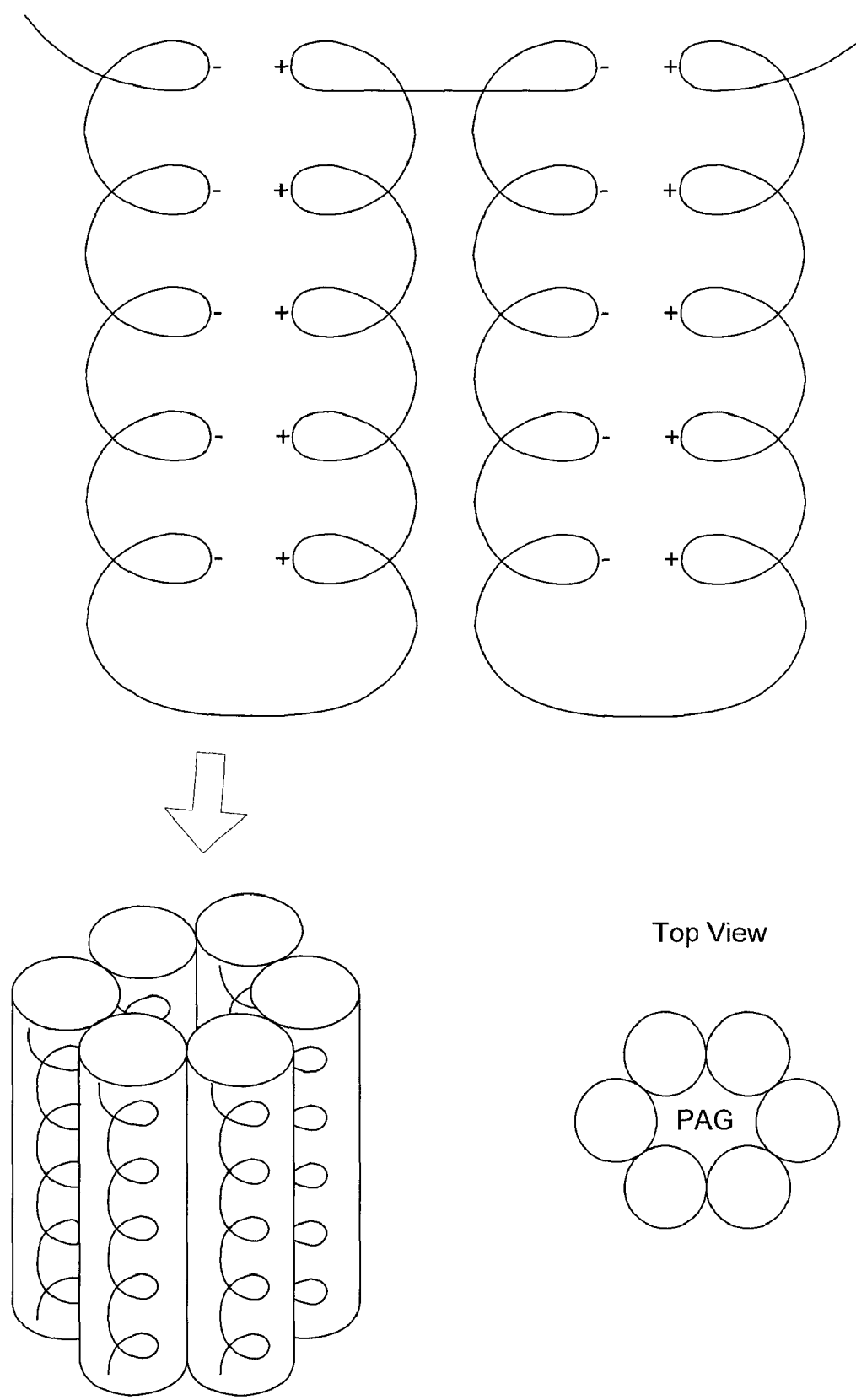
FIG. 4 is an illustration of a tertiary structure where the structures are organized by charge association.

FIG. 4 illustrates an example of a pixilated helical photoresist self-assembled by ionic interactions. In this example, a helical photoimageable copolymer having a helical structure forms a larger pre-organized architecture 420 through the ionic interactions between compounds incorporated into the helices 410. The positive charges 405 line up with the negative charges 415. The ionic interactions between the helices form "cylinders" 430 that form a single pixel 100 of the helical pixilated photoresist. The quenchers will arrange themselves on the outside of the pixel and the photo-acid generator 440 will be sequestered in the interior "pore" of the pixel.

Helical pixilated photoresists may be used to create patterns for the formation of many structures used in integrated circuits. In one embodiment, a chemically amplified pixelated photoresist may be used to form lines for transistor gates. In another embodiment, a chemically amplified helical pixilated photoresist may be used to form trenches or vias for interconnect lines. In one embodiment the chemically amplified helical pixilated photoresists may be used to form both vias and trenches by a conventional dual damascene method. Other applications for forming microelectromechanical machines (MEMS), microfluidics structures, or other small structures are also comprehended. For the sake of simplicity a process of forming only vias will be described.

Figure 5A:
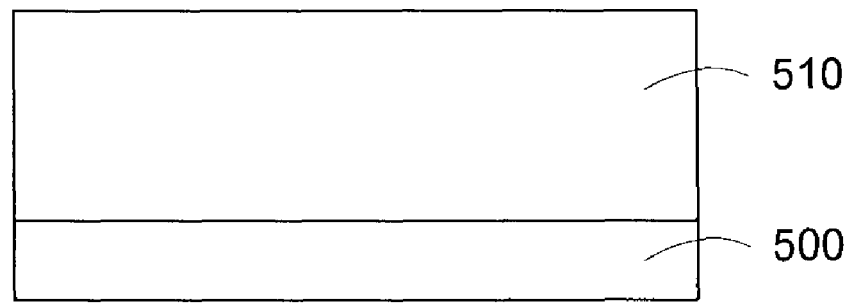
FIGS. 5a-5i illustrate an embodiment of a fabrication of a microelectronic device by photomicrolithography employing a helical pixilated photoresist.

In FIG. 5A, substrate 500 is provided. Substrate 500 may be any surface generated when making an integrated circuit upon which a conductive layer may be formed. In this particular embodiment the substrate 500 may be a semiconductor such as silicon, germanium, gallium arsenide, silicon-on-insulator or silicon on sapphire. A dielectric layer 510 is formed on top of substrate 500. Dielectric layer 510 may be an inorganic material such as silicon dioxide or carbon doped oxide (CDO) or a polymeric low dielectric constant material such as poly(norbornene) such as those sold under the tradename UNITY™, distributed by Promerus, LLC; polyarylene-based dielectrics such as those sold under the tradenames "SiLK™" and "GX-3™", distributed by Dow Chemical Corporation and Honeywell Corporation, respectively; and poly(aryl ether)-based materials such as that sold under the tradename "FLARE™", distributed by Honeywell Corporation. The dielectric layer 410 may have a thickness in the approximate range of 2,000 and 20,000 angstroms.

Figure 5B:
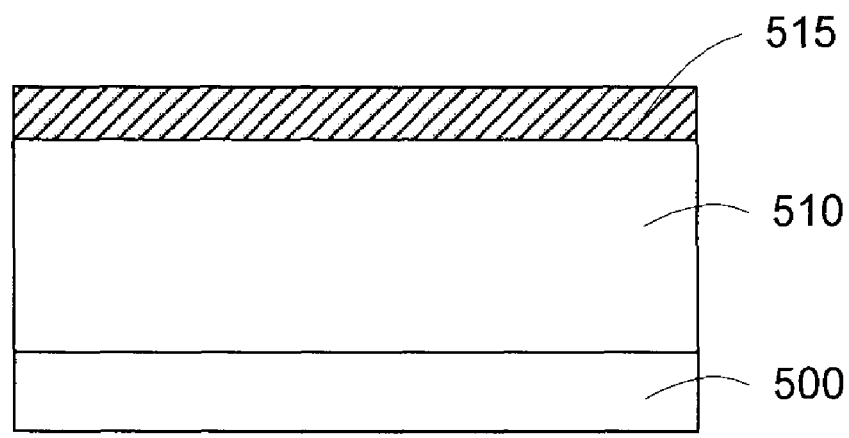

In FIG. 5B, after forming the dielectric layer 510, a bottom anti-reflective coating (BARC) 515 may be formed over the dielectric layer 510. In embodiments where non-light lithography radiation is used a BARC 515 may not be necessary. The BARC 515 is formed from an anti-reflective material that includes a radiation absorbing additive, typically in the form of a dye. The BARC 515 may serve to minimize or eliminate any coherent light from re-entering the helical pixilated 520, that is formed over the BARC 515 in FIG. 5C, during irradiation and patterning of the photoresist 520. The BARC 515 may be formed of a base material and an absorbant dye or pigment. In one embodiment, the base material may be an organic material, such as a polymer, capable of being patterned by etching or by irradiation and developing, like a photoresist. In another embodiment, the BARC 515 base material may be an inorganic material such as silicon dioxide, silicon nitride, and silicon oxynitride. The dye may be an organic or inorganic dye that absorbs light that is used during the exposure step of the photolithographic process.

Figure 5C:
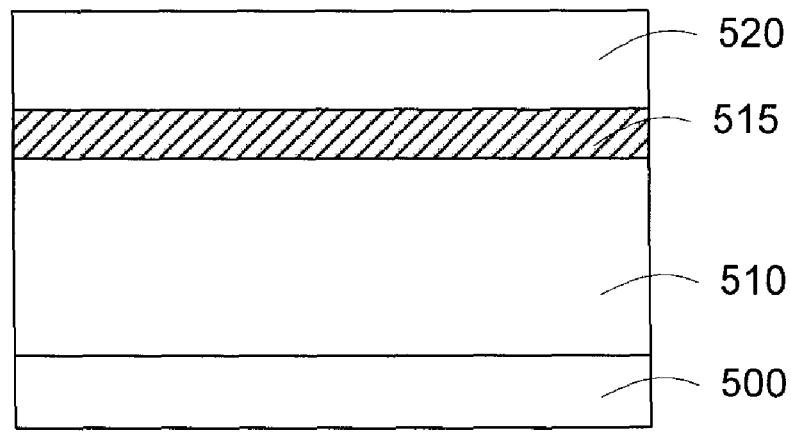

In FIG. 5C a helical pixilated photoresist 520, such as those described above, is formed over the BARC 515. The helical pixilated photoresist 520 may be positive tone or negative tone. In a positive tone photoresist the area exposed to the radiation will define the area where the photoresist will be removed. In a negative tone photoresist the area that is not exposed to the radiation will define the area where the photoresist will be removed. The helical pixilated photoresist 520, in this particular embodiment, is a positive resist. The helical pixilated photoresist 520 may have a thickness sufficient to serve as a mask during an etching or implantation step. For example, the pixilated photoresist 520 may have a thickness in the approximate range of 500 angstroms and 2500 angstroms. In general, for implant purposes the pixilated photoresist 520 will be thickest, for contact patterning the pixilated photoresist 520 will be thinner than for implant purposes, and the pixilated photoresist 520 will be thinnest for gate patterning.

The pixilated photoresist 520 contains pixels as described above that may be in the form of polymer chains, bulky clusters, or micelles. These pixels each contain a PAG, a photoimageable species having a solubility switch, and a quencher. The pixilated photoresist 520 is formed by solvating the pixels or pixel components within a compatible solvent and by optionally adding additives. The ratio of PAG/photoimageable species/quencher may be in the approximate range of 1/10/1 and 1/100/3. The additives in the photoresist 520 may be any one of or a combination of a plasticizer, a surfactant, adhesion promoter, an acid amplifier, a dissolution inhibitor, a dissolution promoter, a photobase, or a photodecomposable base. The pixels and the additives of the photoresist 520 are mixed with a solvent. The solvent may be non-aqueous, for example, polypropylene glycol monomethyl ether acetate (PGMEA), propylene glycol monomethyl ether (PGME), ethyl lactate, gammabutylolactone (GBL), cyclopentanone, heptanone, or cyclohexanone. The solvent, in the situation where the pixels of the photoresist 520 are regular micelles having a hydrophilic surface are solvated, may be polar and/or an aqueous solvent. Examples of polar solvents include alcohols such as butanol, ethanol, and isopropanol, acetone, and water. In another example, water may be used as a polar solvent. An aqueous solvent may be valuable in that water is more environmentally safe than most organic solvents. The choice of solvent depends on the polarity and architecture of the components used to form the photoresist. The amount of solvent is also dependent on the thickness of the photoresist and on the size of the wafer. If a thicker pixilated photoresist 520 is desired then less solvent is used, and if a thinner pixilated photoresist 520 is desired more solvent is used. Also, the larger the wafer the more solvent is used. In a particular embodiment, for the pixilated photoresist 520 used for 248 nm, 193 nm, and EUV (in particular 13.5 nm) the amount of solvent used may be in the approximate range of 1% to 5% by weight solid of the pixilated photoresist 520.

Figure 5D:
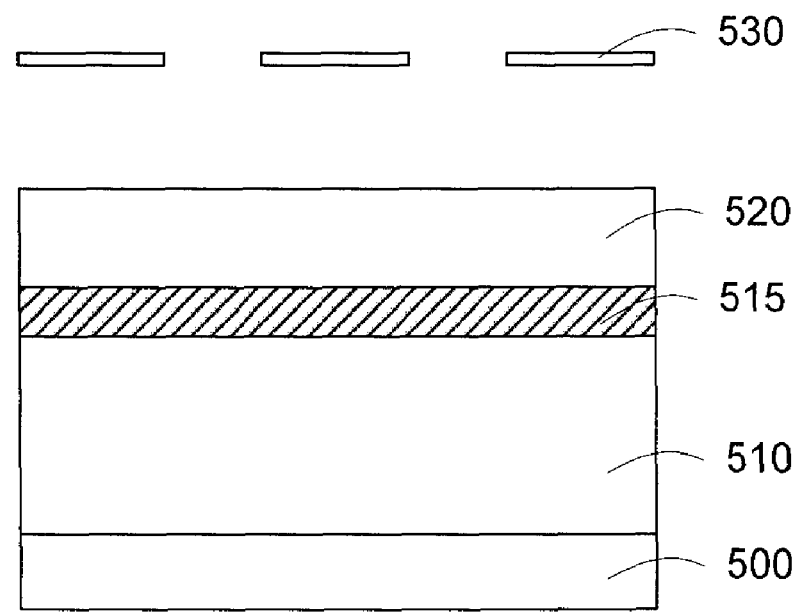
Figure 5E:
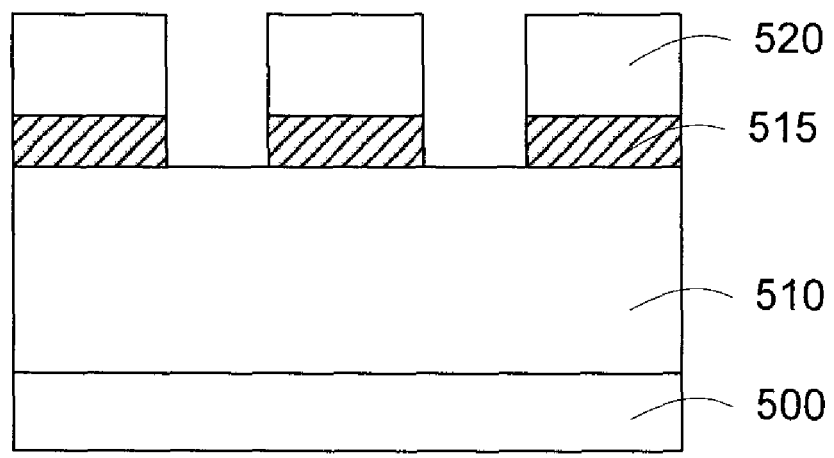

As illustrated in FIG. 5D, a mask 530 is formed over the photoresist 520. In FIG. 5E, the photoresist 520 and the BARC 515 are patterned by exposing the masked layer to radiation. The radiation may be 193 nm, 157 nm, deep ultraviolet (DUV), extreme ultraviolet (EUV), electron beam projection, or ion beam lithographic technologies. In one particular embodiment, the irradiation used to pattern the photoresist 520 may be EUV having a wavelength of 13.5 nm. Upon irradiation, the PAG within the irradiated pixels of the pixilated photoresist 520 dissociates to form a photo-generated acid. The photo-generated acid may serve as a catalyst to deprotect and to change the solubility of the photoimageable species. The change in the solubility of the photoimageable species is to enable the solvation of the photoimageable species within the pixels and the removal of a positive photoresist by a developer. In a negative photoresist the superacid will catalyze the cross-linking of the photoimageable species between pixels, and the developer that is subsequently applied will remove the portions of the negative photoresist that were not cross-linked. A post-exposure bake may be performed on the pixilated photoresist 520 to enhance the mobility and hence the diffusion of the photo-generated acid within the pixilated photoresist 520. The post-exposure bake may be performed at a temperature in the approximate range of 90° C. and 150° C. and for a time in the approximate range of 30 seconds and 90 seconds. The temperature and the time of the post-exposure bake are dependent on the chemistry of the pixilated photoresist 520. The developer may be applied after the post-exposure bake to remove the desired portions of the pixilated photoresist 520. The developer may be a basic aqueous solution.

Figure 5F:
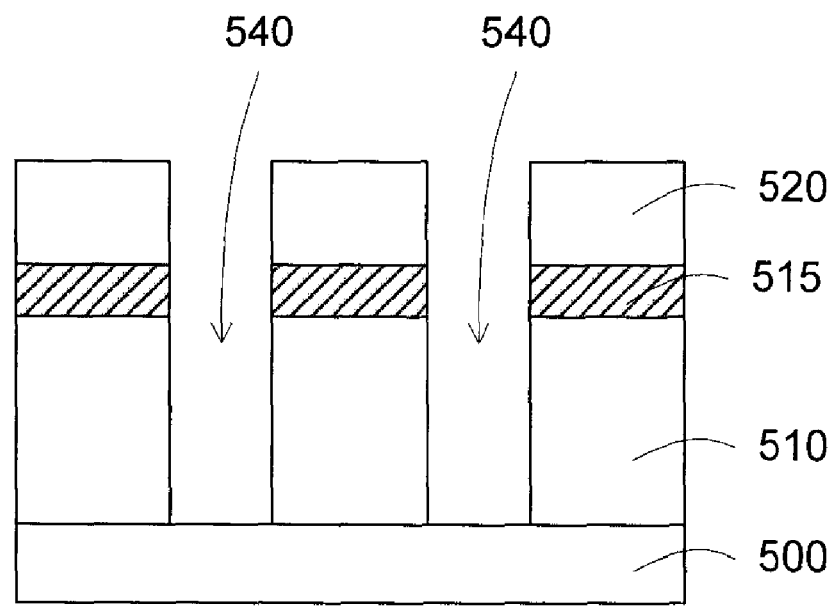
Figure 5G:
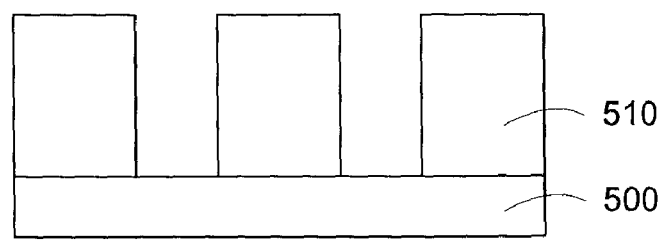

After the pixilated photoresist 520 is developed, vias 540 are etched through dielectric layer 510 down to substrate 500, as illustrated in FIG. 5F. Conventional process steps for etching through a dielectric layer may be used to etch the via, e.g., a conventional anisotropic dry oxide etch process. When silicon dioxide is used to form dielectric layer 510, the via may be etched using a medium density magnetically enhanced reactive ion etching system ("MERIE" system) using fluorocarbon chemistry, or using other typical dry etch chemistries as is known to those skilled in the art. When a polymer is used to form dielectric layer 510, a forming gas chemistry, e.g., one including nitrogen and either hydrogen or oxygen, may be used to etch the polymer, or using other typical dry etch chemistries as is known to those skilled in the art. After vias 540 are formed through dielectric layer 510, the pixilated photoresist 520 and the BARC 515 are removed as illustrated in FIG. 5G. The pixilated photoresist 520 and BARC 515 may be removed using a conventional ashing procedure.

Figure 5H:
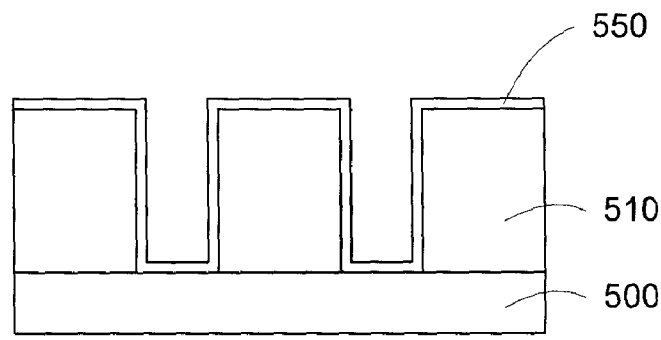

A barrier layer 550 is then formed over the vias 540 and the dielectric 510 as illustrated in FIG. 5H. The barrier layer 550 may comprise a refractory material, such as titanium nitride or tantalum nitride and may have a thickness in the approximate range of 100 and 500 angstroms. The barrier layer may be deposited by chemical vapor deposition (CVD), sputter deposition, or atomic layer deposition (ALD). The purpose of the barrier layer 550 is to prevent metals such as copper that migrate at temperatures used in semiconductor processing from migrating out of the vias and causing shorts. A metal layer 560 is then deposited into the vias 540. The metal layer may be copper, copper alloy, gold, or silver. In one particular embodiment copper is deposited to form the metal layer 560. Copper may be deposited by electroplating or electroless (catalytic) deposition that require first depositing a seed material in the vias 540. Suitable seed materials for the deposition of copper by electroplating or electroless deposition include copper and nickel. The barrier layer 550 may also serve as the seed layer.

Figure 5I:
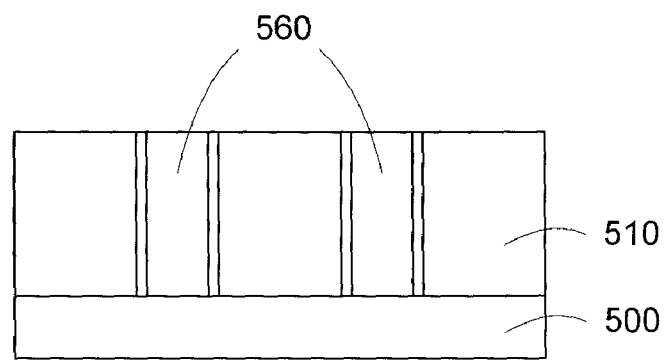

FIG. 5I illustrates the structure that results after filling vias 540 with a conductive material and planarizing, using a process such as chemical mechanical planarization (CMP). Although the embodiment illustrated in FIG. 5I illustrates only one dielectric layer 500 and vias 540, the process described above may be repeated to form additional conductive and insulating layers until the desired integrated circuit is produced.

Several embodiments of the invention have thus been described. However, those of ordinary skill in the art will recognize that the invention is not limited to the embodiments described, but can be practiced with modification and alteration within the scope and spirit of the appended claims that follow.

I claim:

1. A photoresist composition, comprising:
   a photoacid generator;
   a photoimageable polymer comprising a self-assembly moiety and a solubility switch and also comprising a pyridine-containing quencher, wherein the photoimageable polymer has a helical structure formed by pi-stacking of the pyridine-containing quencher, wherein the photoacid generator is disposed within the helical structure of the photoimageable polymer.

2. The photoresist composition of claim 1, wherein the pyridine-containing quencher copolymer comprises bipyridine dicarboxylic acid.

3. The photoresist composition of claim 1, wherein the solubility switch comprises a diol.

4. The photoresist composition of claim 1, wherein the self-assembly moiety is chosen from the group consisting of a nitrile, aryl and amine.

* * * * *